(12) United States Patent
Xie

(10) Patent No.: US 10,964,675 B1
(45) Date of Patent: Mar. 30, 2021

(54) DISPLAY DEVICE AND MANUFACTURING METHOD THEREOF

(71) Applicant: Shenzhen China Star Optoelectronics Semiconductor Display Technology Co., Ltd., Guangdong (CN)

(72) Inventor: Huafei Xie, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/626,307

(22) PCT Filed: Oct. 14, 2019

(86) PCT No.: PCT/CN2019/111007
§ 371 (c)(1),
(2) Date: Dec. 23, 2019

(30) Foreign Application Priority Data

Sep. 20, 2019 (CN) .......................... 201910894456.X

(51) Int. Cl.
*H01L 25/075* (2006.01)
*H01L 33/62* (2010.01)
*H01L 27/12* (2006.01)

(52) U.S. Cl.
CPC ........ *H01L 25/0753* (2013.01); *H01L 27/124* (2013.01); *H01L 33/62* (2013.01); *H01L 2933/0066* (2013.01)

(58) Field of Classification Search
CPC ... H01L 25/0753; H01L 27/124; H01L 33/62; H01L 2933/0066
See application file for complete search history.

(56) References Cited

U.S. PATENT DOCUMENTS

| | | | |
|---|---|---|---|
| 4,654,629 A * | 3/1987 | Bezos | B60Q 1/2696 246/473.3 |
| 6,244,728 B1 * | 6/2001 | Cote | F21V 5/04 362/249.06 |
| 2008/0030991 A1 * | 2/2008 | Yeh | H05K 3/301 362/249.01 |
| 2008/0290357 A1 * | 11/2008 | Lin | H01L 25/0753 257/98 |
| 2009/0109674 A1 * | 4/2009 | Lodhie | F21K 9/232 362/249.02 |
| 2010/0157595 A1 * | 6/2010 | Lin | F21K 9/00 362/235 |

(Continued)

*Primary Examiner* — Victor A Mandala

(57) ABSTRACT

The present invention provides a display device and a manufacturing method thereof, the method comprising: providing a backplate, the backplate comprises a substrate and a driving circuit set on the substrate; providing a plurality of LED chips; transferring the LED chips vertically to the backplate to electrically connect the bottom electrode of the LED chips to the driving circuit; providing a cover plate, the cover plate comprises a plate body and a ground circuit set on the plate body; covering the backplate with the cover plate, such that the ground circuit is aligned with at least a portion of the driving circuit, and the top electrode of each of the LED chips is electrically connected to the ground circuit; and pressing the cover plate, such that the LED chips are tilted relative to a vertical direction.

10 Claims, 5 Drawing Sheets

(56) References Cited

U.S. PATENT DOCUMENTS

| | | | |
|---|---|---|---|
| 2011/0261564 A1* | 10/2011 | Grootveld | F21S 8/00 362/235 |
| 2013/0093963 A1* | 4/2013 | Kasai | G02F 1/133603 348/739 |
| 2013/0099267 A1* | 4/2013 | Jang | H01L 33/60 257/98 |
| 2017/0138549 A1* | 5/2017 | Do | H01L 25/0753 |
| 2019/0198576 A1* | 6/2019 | Schubert | G02B 26/004 |
| 2019/0305035 A1* | 10/2019 | Cho | G09G 3/32 |
| 2020/0013759 A1* | 1/2020 | Yoo | H01L 25/0753 |

* cited by examiner

DISPLAY DEVICE AND MANUFACTURING METHOD THEREOF

BACKGROUND OF INVENTION

Field of Invention

The present invention relates to the display technology field, particularly to a display device and a manufacturing method thereof.

Description of Prior Art

Due to the advantages of high display quality, power saving, thinness, and wide application range, flat display devices have been widely used in a variety of consumer electronic products such as mobile phones, TV sets, personal digital assistants, digital cameras, laptops, and desktop computers, and have gone mainstream.

Micro light emitting diode (micro LED)/mini light emitting diode (mini LED) display devices are a kind of display devices that display images by an array of small size LEDs in high density integrated on a substrate as pixels. Like a large size outdoor LED display device, each pixel of a micro LED/mini LED display device can be addressed and driven individually, and micro LED/mini LED display devices can be deemed as a smaller version of an outdoor LED display device.

Both micro LED/mini LED display devices and organic light emitting diode (OLED) display devices reduce the pixel distance from millimeters to microns, and are self-luminous display devices. However, because micro LED/mini LED display devices have the advantages of better material stability, longer life, and no image imprint, they are deemed as the biggest competitors of OLED display devices.

Consumers who have experienced a virtual reality (VR)/augmented reality (AR) head-mounted display device are aware of the fact that improving the resolution is the biggest bottleneck for developing the head-mount display device. The higher resolution leads the virtual picture displayed to be closer to the real world, and of course sufficient brightness and real color representation are also required. The requirements are 10 times higher than those of the best display device for sale in the Clean specification market. Take 10000 nit brightness for example. It is only the micro LED/mini LED display device that has such kind of potential to achieve the brightness. In addition, micro LED/mini LED display devices can be applied in automobiles and other application environments.

The application environment of AR/VR display devices and automobile glass windshields requires that display devices should have high resolution and penetration. Although the present micro LED/mini LED display devices can achieve 50% of penetration in a way of active driving by manufacturing metal oxide semiconductor thin film transistor on a glass substrate, it is not enough to satisfy the need of the application environment of AR/VR display devices and automobile glass windshields, which requires a penetration greater than 70%.

SUMMARY OF INVENTION

The present invention provides a method for manufacturing a display device in one aspect to increase the resolution and penetration of the display device and to improve the display quality.

The present invention provides a display device in another aspect to increase the resolution and penetration of the display device and to improve the display quality.

In order to achieve at least one aspect mentioned above, the present invention provides a method for manufacturing a display device, comprising following steps:

providing a backplate, wherein the backplate comprises a substrate and a driving circuit set on the substrate;

providing a plurality of light emitting diode chips, wherein each of the LED chips comprises a bottom electrode and a top electrode;

transferring the LED chips vertically to the backplate to electrically connect the bottom electrode of the LED chips to the driving circuit;

providing a cover plate, wherein the cover plate comprises a plate body and a ground circuit set on the plate body;

covering the backplate with the cover plate, such that the ground circuit is aligned with at least a portion of the driving circuit, and the top electrode of each of the LED chips is electrically connected to the ground circuit; and pressing the cover plate, such that the LED chips are tilted relative to a vertical direction.

The LED chips are mini LED chips or micro LED chips.

The driving circuit comprises a plurality of thin film transistors, a plurality of scan lines, and a plurality of data lines, the thin film transistors are arranged in an array, each of the scan lines is electrically connected to gate electrodes of a row of the thin film transistors, each of the data lines is electrically connected to source electrodes of a column of the thin film transistors, and the bottom electrode of the LED chips is electrically connected to a drain electrode of the thin film transistor.

The ground circuit comprises a plurality of ground lines, and each of the ground lines is aligned with one scan line or one data line after the backplate and the cover plate are covered.

The bottom electrode and the top electrode of the LED chips are electrically connected to the driving circuit and the ground circuit by solder paste, respectively.

The present invention provides a display device, comprising a backplate and a cover plate correspondingly disposed, wherein a plurality of LED chips are set between the backplate and the cover plate;

the backplate comprises a substrate and a driving circuit set on the substrate;

the cover plate comprises a plate body and a ground circuit on the plate body, and the ground circuit is aligned with at least a portion of the driving circuit; and each of the LED chips comprises a bottom electrode and a top electrode, wherein the bottom electrode is electrically connected to the driving circuit, the top electrode is electrically connected to the ground circuit, and the LED chips are tilted relative to a vertical direction.

The LED chips are mini LED chips or micro LED chips.

The driving circuit comprises a plurality of thin film transistors, a plurality of scan lines, and a plurality of data lines, the thin film transistors are arranged in an array, each of the scan lines is electrically connected to gate electrodes of a row of the thin film transistors, each of the data lines is electrically connected to source electrodes of a column of the thin film transistors, and the bottom electrode of the LED chips is electrically connected to a drain electrode of the thin film transistor.

The ground circuit comprises a plurality of ground lines, and each of the ground lines is aligned with one scan line or one data line.

The bottom electrode and the top electrode of the LED chips are electrically connected to the driving circuit and the ground circuit by solder paste, respectively.

The advantageous effects of the present invention: the present invention provides a method for manufacturing a display device, comprising: providing a backplate, the backplate comprises a substrate and a driving circuit set on the substrate; providing a plurality of LED chips, each LED chip comprises a bottom electrode and a top electrode; transferring the LED chips vertically to the backplate to electrically connect the bottom electrode of the LED chip to the driving circuit; providing a cover plate, the cover plate comprises a plate body and a ground circuit set on the plate body; covering the backplate with the cover plate, wherein such that the ground circuit is aligned with at least a portion of the driving circuit, and the top electrode of each the LED chip is electrically connected to the ground circuit; pressing the cover plate, such that the LED chips are tilted relative to a vertical direction. By adjusting the position of the LED chips, the resolution and the penetration of the display device are increased, and the display quality is improved. The present invention also provides a display device which increases the resolution and the penetration of the display device and improves the display quality.

BRIEF DESCRIPTION OF DRAWINGS

Please refer to the following description and figures of the present invention to have a better understanding of the characteristics and technical content of the present invention.

In the figures.

DETAILED DESCRIPTION OF PREFERRED EMBODIMENTS

Following describes in detail with preferred embodiments and figures of the present invention to further illustrate the technical means and effect of the present invention.

Figure 1:
FIG. 1 is a schematic diagram of step S1 of a method for manufacturing a display device of the present invention.
Figure 10:
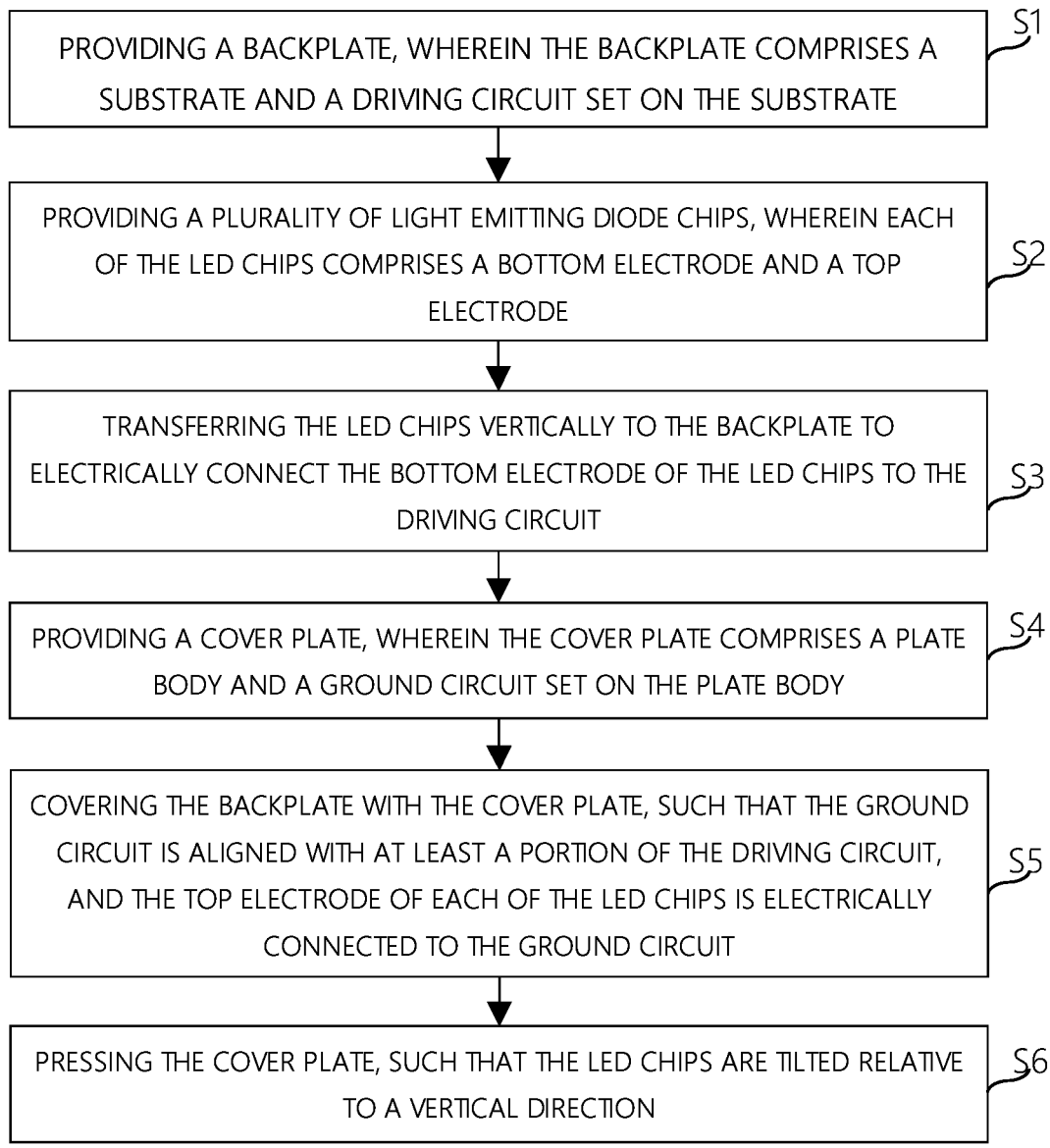
FIG. 10 is a flow chart of the method for manufacturing the display device of the present invention.

Please refer to FIG. 10, the present invention provides a method for manufacturing a display device, comprising:

Step S1, as shown in FIG. 1, providing a backplate, the backplate comprises a substrate 1 and a driving circuit 2 set on the substrate 1.

Figure 8:
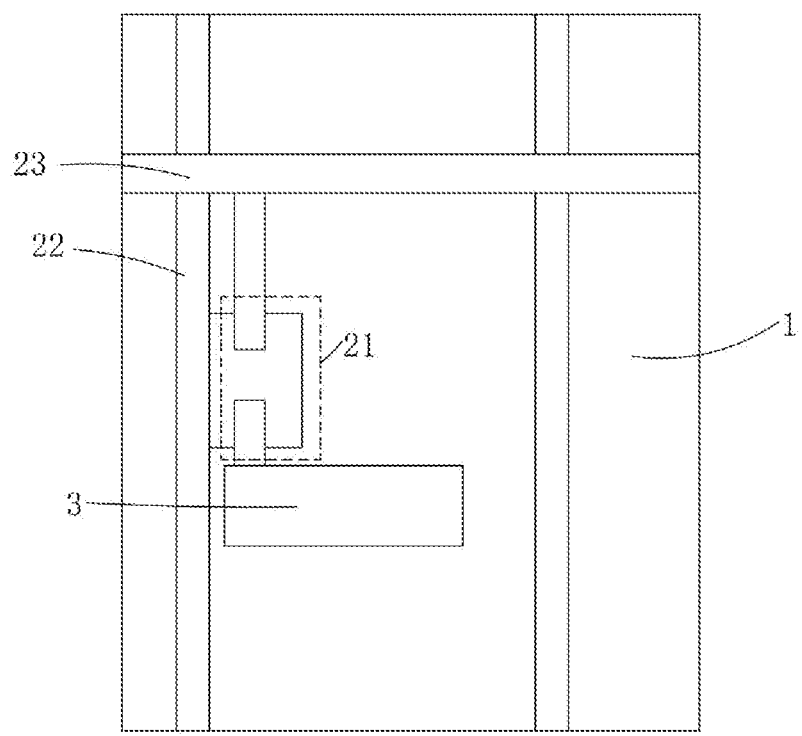
FIG. 8 is a schematic diagram of a driving circuit of the display device of the present invention.

Specifically, as shown in FIG. 8, the driving circuit 2 comprises a plurality of thin film transistors 21, a plurality of scan lines 22, and a plurality of data lines 23, the thin film transistors 21 are arranged in an array, each scan line 22 is electrically connected to a row of the gate electrodes of the thin film transistors 21, and each data line 23 is electrically connected to a column of the source electrodes of the thin film transistors 21.

Figure 3:
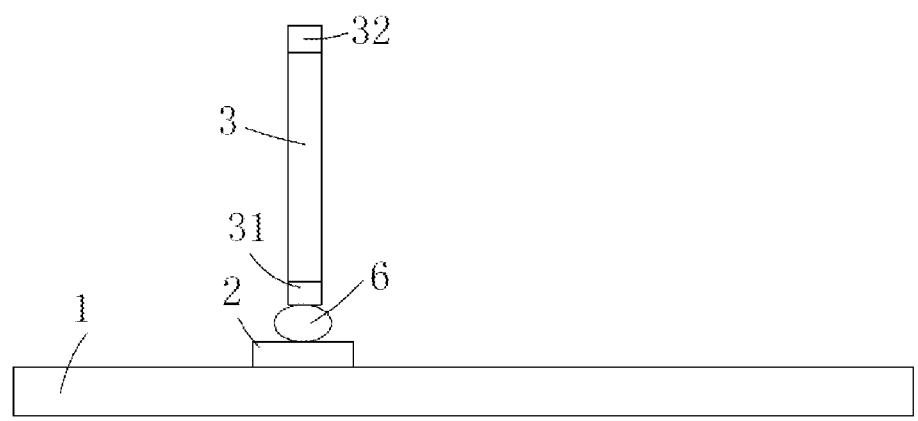

Step S2, as shown in FIG. 3, providing a plurality of light emitting diode chips 3, and each LED chip 3 comprises a bottom electrode 31 and a top electrode 32.

Specifically, the LEDs chip 3 are mini LED chips or a micro LED chips.

Step S3, as shown in FIG. 3, transferring the LED chips 3 vertically to the backplate 1 to electrically connect the bottom electrode of the LED chips 3 to the driving circuit 2.

Figure 2:
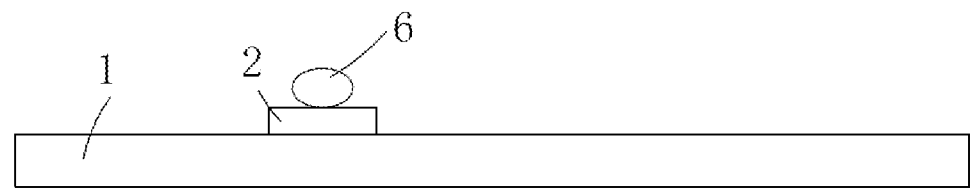
FIG. 2 and FIG. 3 are schematic diagrams of step S1 to step S3 in the method for manufacturing the display device of the present invention.

Specifically, refer to FIG. 2, the step S3 in detail is: cleaning the backplate 10, setting solder paste on the drain electrode of each thin film transistor 21, then transferring a plurality of the LED chips 3 vertically to the solder paste by vacuum adsorbing, and finally fixing the LED chips 3 with the solder paste after fluidifying the solder paste at high temperature and curing the solder paste to connect the bottom electrode 31 of each LED chip 3 to the drain electrode of each thin film transistor 21 electrically.

Figure 4:
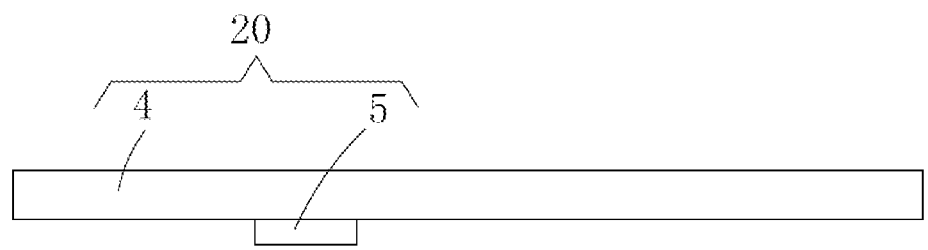
FIG. 4 is a schematic diagram of step S4 of the method for manufacturing the display device of the present invention.

Step S4, as shown in FIG. 4, providing a cover plate 20, and the cover plate 20 comprises a plate body 4 and a ground circuit 5 set on the plate body 4.

Figure 5:
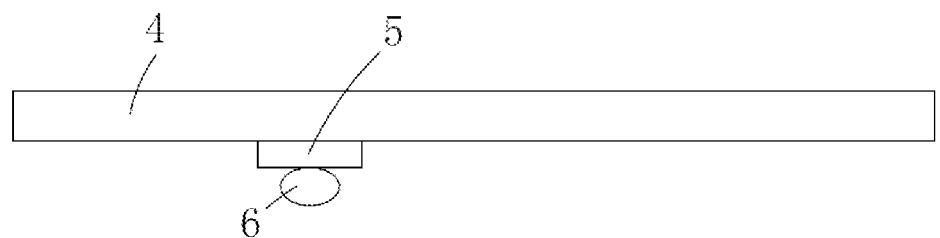
FIG. 5 and FIG. 6 are schematic diagrams of step S5 of the method for manufacturing the display device of the present invention.
Figure 6:
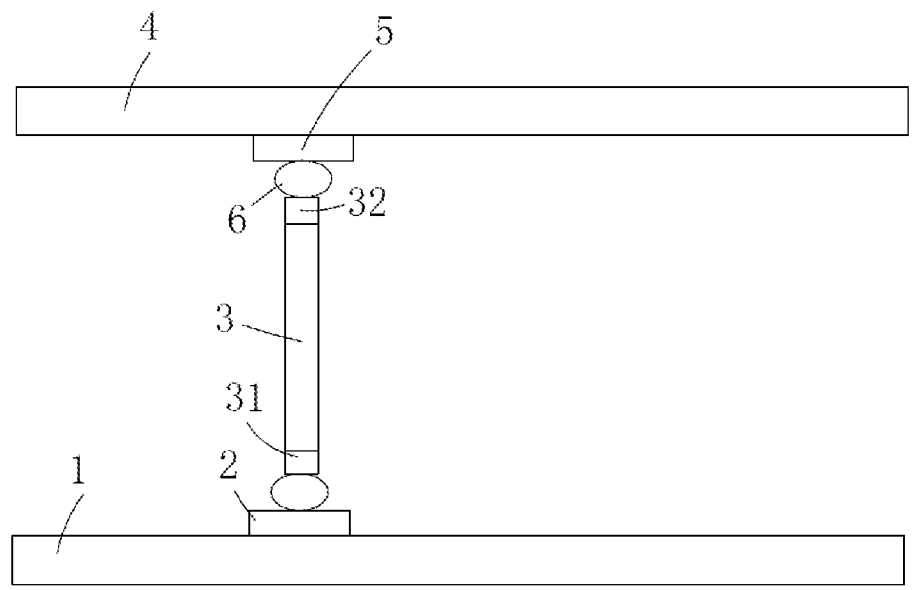

Step S5, as shown in FIG. 5 and FIG. 6, covering the backplate 10 with the cover plate 20, such that the ground circuit 5 is aligned with at least a portion of the driving circuit 2, and the top electrode 32 of each the LED chip 3 is electrically connected to the ground circuit 5.

Figure 9:
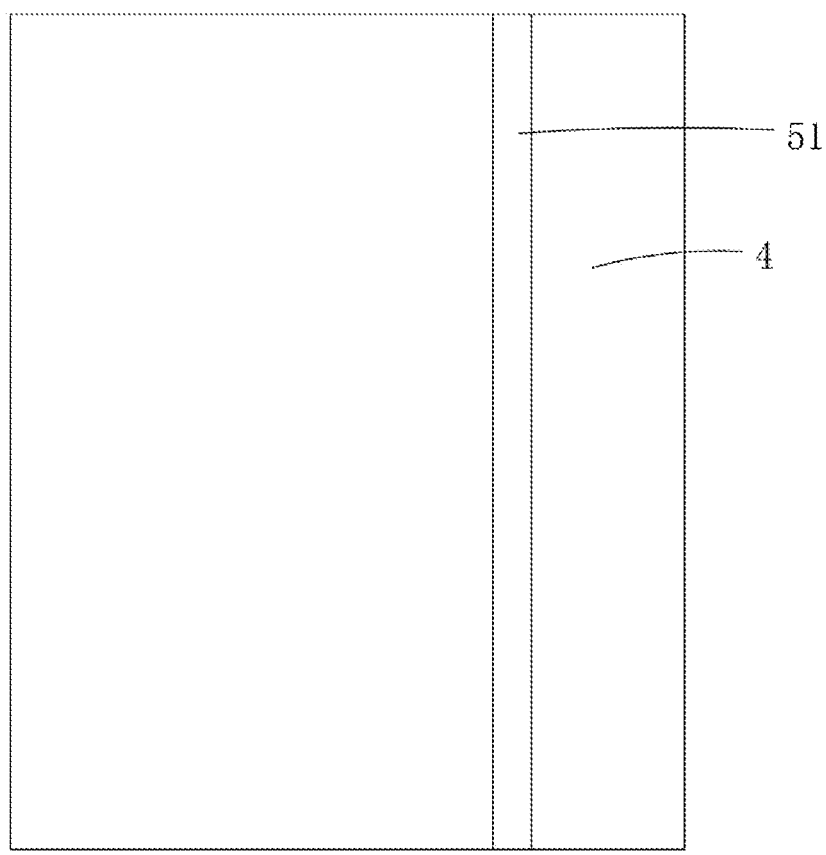
FIG. 9 is a schematic diagram of a ground circuit of the display device of the present invention.

Specifically, as shown in FIG. 9, the ground circuit 5 comprises a plurality of ground lines 51, and each ground lines 51 is aligned with the scan line 22 or the data line 23 after the backplate and the cover plate are covered.

Furthermore, aligning marks are set on both the backplate 10 and the cover plate 20 in order to ensure the accuracy of aligning.

Specifically, in the step S5, the cover plate 20 is placed on the backplate 10 after cleaning, and the ground lines 51 of the cover plate 20 and the scan lines 22 or the data lines 23 of the backplate 10 are overlapped and aligned through the aligning marks of the backplate 10 and the cover plate 20, which reduces the influence of wires on the penetration of the display device, and the LED chips 3 standing on the backplate 10 is in contact with the solder paste 6 of the cover plate 20, wherein such that the top electrodes of each LED chip 3 connects to the ground circuit 5 electrically.

Figure 7:
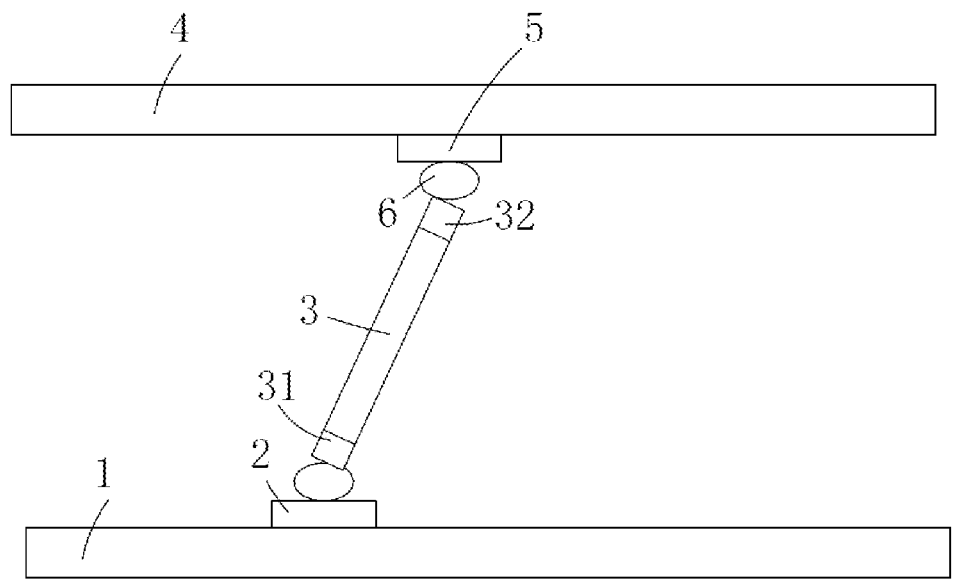
FIG. 7 is a schematic diagram of step S6 of the method for manufacturing the display device and a schematic diagram of the display device of the present invention.

Step S6, as shown in FIG. 7, pressing the cover plate 20, such that the LED chips 3 are tilted relative to a vertical direction.

Specifically, in the step S6, slowly melting the solder paste 6 set on the plate 10 and the cover 20 again by controlling the temperature, and pressing the cover plate 20 to tilt the LED chips 3 at the same time, the tilt angle of the LED chips 3 is set by controlling the thickness of the display device, so that the purpose of controlling the transparency of the display device with various penetration can be realized.

Thus, the LED chips 3 are placed in a tilted position in a vertical direction in the present invention, which simplifies the structure, enlarges the adjustable space, and increases the product yield, and as the ground circuit and the driving circuit are overlapped partially, which reduces the projection area of the wire and the LED chips 3, the penetration of the display device equipped with mini LED chips or micro LED chips is increased prominently, and as the size of the pixel is adjusted by controlling the thickness of the display device, the resolution of the display device can be adjusted and designed effectively.

Please refer to FIG. 7, FIG. 8 and FIG. 9, the present invention provides a display device, comprising a backplate 10 and a cover plate 20 correspondingly disposed, and a plurality of LED chips 3 set between the backplate 10 and the cover plate 20;

The backplate 10 comprises a substrate 1 and a driving circuit 2 set on the substrate 1;

The cover plate 20 comprises a plate body 4 and a ground circuit 5 set on the plate body 4, and the ground circuit 5 is aligned with at least a portion of the driving circuit 2;

Each LED chip 3 comprises a bottom electrode 31 and a top electrode 32, the bottom electrode 31 is electrically connected to the driving circuit 2, the top electrode 32 is electrically connected to the ground circuit 5, and the LED chips 3 are tilted relative to a vertical direction.

Specifically, the LED chips 3 are mini LED chips or micro LED chips.

Specifically, the driving circuit 2 comprises a plurality of thin film transistors 21, a plurality of scan lines 22 and a plurality of data lines 23, the thin film transistors 21 are arranged in an array, each of the scan lines 22 is electrically connected to a row of the gate electrodes of the thin film transistors 21, each of the data lines 23 is electrically connected to a column of the source electrodes of the thin film transistors, and the bottom electrode of each LED chip 3 is electrically connected to a drain electrode of the thin film transistor 21.

Specifically, the ground circuit 5 comprises a plurality of ground lines 51, each ground line 51 is aligned with the scan line 22 or the data line 23.

Specifically, the bottom electrode and the top electrode of the LED chips 3 are electrically connected to the driving circuit 2 and the ground circuit 5 by solder paste 6, respectively.

Furthermore, aligning marks are set on both the backplate 10 and the cover plate 20 in order to ensure the accuracy of aligning.

Specifically, overlapping the ground lines 51 of the cover plate 20 and the scan lines 22 or the data lines 23 of the backplate 10 aligned through the aligning marks of the backplate 10 and the cover plate 20, so as to reduce the influence of wires on the penetration of the display device.

Specially, the LED chips 3 are placed tilted relative to a vertical direction in the present invention, which simplifies the structure, enlarges the adjustable space and increases the product yield, and as the ground circuit and the driving circuit are overlapped partially to reduce the projection area of the wire and the LED chips 3, the penetration of the display device equipped with mini LED chips or micro LED chips is increased prominently, and as the size of the pixel is adjusted by controlling the thickness of the display device, the resolution of the display device can be adjusted and designed effectively.

In conclusion, the present invention provides a method for manufacturing a display device, comprising: providing a backplate, the backplate comprises a substrate and a driving circuit set on the substrate; providing a plurality of LED chips, each LED chip comprises a bottom electrode and a top electrode; transferring the LED chips vertically to the backplate to electrically connect the bottom electrode of the LED chips to the driving circuit; providing a cover plate, the cover plate comprises a plate body and a ground circuit set on the plate body; covering the backplate with the cover plate, such that the ground circuit is aligned with at least a portion of the driving circuit, and the top electrode of each LED chip is electrically connected to the ground circuit; pressing the cover plate, such that the LED chips are tilted relative to a vertical direction. By adjusting the position of the LED chips, the resolution and the penetration of the display device are increased, and the display quality is improved. The present invention also provides a display device, which increases the resolution and the penetration of the display device and improves the display quality.

As described above, a person skilled in the art may make various other corresponding changes and deformation according to the technical scheme and technical conception of the present invention, and all such changes and deformation shall fall within the protection scope of the claims of the present invention.

What is claimed is:

1. A method for manufacturing a display device, comprising following steps:
   providing a backplate, wherein the backplate comprises a substrate and a driving circuit set on the substrate;
   providing a plurality of light emitting diode chips, wherein each of the LED chips comprises a bottom electrode and a top electrode;
   transferring the LED chips vertically to the backplate to electrically connect the bottom electrode of the LED chips to the driving circuit;
   providing a cover plate, wherein the cover plate comprises a plate body and a ground circuit set on the plate body;
   covering the backplate with the cover plate, such that the ground circuit is aligned with at least a portion of the driving circuit, and the top electrode of each of the LED chips is electrically connected to the ground circuit; and
   pressing the cover plate, such that the LED chips are tilted relative to a vertical direction.

2. The method as claimed in claim 1, wherein the LED chips are mini LED chips or micro LED chips.

3. The method as claimed in claim 1, wherein the driving circuit comprises a plurality of thin film transistors, a plurality of scan lines, and a plurality of data lines, the thin film transistors are arranged in an array, each of the scan lines is electrically connected to gate electrodes of a row of the thin film transistors, each of the data lines is electrically connected to source electrodes of a column of the thin film transistors, and the bottom electrode of the LED chips is electrically connected to a drain electrode of the thin film transistor.

4. The method as claimed in claim 3, wherein the ground circuit comprises a plurality of ground lines, and each of the ground lines is aligned with one scan line or one data line after the backplate and the cover plate are covered.

5. The method as claimed in claim 1, wherein the bottom electrode and the top electrode of the LED chips are electrically connected to the driving circuit and the ground circuit by solder paste, respectively.

6. A display device, comprising a backplate and a cover plate correspondingly disposed, wherein a plurality of LED chips are set between the backplate and the cover plate;
   the backplate comprises a substrate and a driving circuit set on the substrate;
   the cover plate comprises a plate body and a ground circuit on the plate body, and the ground circuit is aligned with at least a portion of the driving circuit; and
   each of the LED chips comprises a bottom electrode and a top electrode, wherein the bottom electrode is electrically connected to the driving circuit, the top electrode is electrically connected to the ground circuit, and the LED chips are tilted relative to a vertical direction.

7. The display device as claimed in claim 6, wherein the LED chips are mini LED chips or micro LED chips.

8. The display device as claimed in claim 6, wherein the driving circuit comprises a plurality of thin film transistors, a plurality of scan lines, and a plurality of data lines, the thin film transistors are arranged in an array, each of the scan lines is electrically connected to gate electrodes of a row of the thin film transistors, each of the data lines is electrically connected to source electrodes of a column of the thin film transistors, and the bottom electrode of the LED chips is electrically connected to a drain electrode of the thin film transistor.

9. The display device as claimed in claim 8, wherein the ground circuit comprises a plurality of ground lines, and each of the ground lines is aligned with one scan line or one data line.

10. The display device as claimed in claim 6, wherein the bottom electrode and the top electrode of the LED chips are electrically connected to the driving circuit and the ground circuit by solder paste, respectively.

\* \* \* \* \*